US012685149B2

(12) United States Patent
Ray et al.

(10) Patent No.: US 12,685,149 B2
(45) Date of Patent: Jul. 14, 2026

(54) BACKSIDE DEEP TRENCH CAPACITOR AND INDUCTOR STRUCTURES

(71) Applicant: Murata Manufacturing Co., Ltd., Kyoto (JP)

(72) Inventors: Shishir Ray, San Diego, CA (US); Anil Kumar, San Diego, CA (US); Sinan Goktepeli, Austin, TX (US); Kouassi Sebastien Kouassi, San Diego, CA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 460 days.

(21) Appl. No.: 18/087,484

(22) Filed: Dec. 22, 2022

(65) Prior Publication Data

US 2024/0213139 A1 Jun. 27, 2024

(51) Int. Cl.
| | |
|---|---|
| *H10D 1/20* | (2025.01) |
| *H01L 23/522* | (2006.01) |
| *H10W 20/20* | (2026.01) |
| *H10W 20/41* | (2026.01) |
| *H10D 84/01* | (2025.01) |
| *H10D 84/03* | (2025.01) |

(52) U.S. Cl.
CPC ......... *H01L 23/5223* (2013.01); *H10W 20/20* (2026.01); *H10W 20/427* (2026.01); *H10D 84/0149* (2025.01); *H10D 84/038* (2025.01)

(58) Field of Classification Search
CPC ........... H01L 21/76898; H01L 23/5223; H01L 23/5286; H01L 23/481; H10D 84/0149; H10D 84/038; H10D 1/716
See application file for complete search history.

(56) References Cited

U.S. PATENT DOCUMENTS

| | | |
|---|---|---|
| 10,777,636 B1 | 9/2020 | Paul |
| 2013/0249052 A1 | 9/2013 | Appleyard |
| 2015/0235944 A1 | 8/2015 | Filippi |
| | (Continued) | |

OTHER PUBLICATIONS

Hedouin, Mathias, International Search Report and Written Opinion received from the PEO dated Apr. 24, 2024 for appln. No. PCT/US2023/084065, 11 pgs.

*Primary Examiner* — Omar F Mojaddedi
(74) *Attorney, Agent, or Firm* — Steinfl + Bruno LLP

(57) ABSTRACT

Single-chip solutions that result in high capacitance and/or inductance densities. Embodiments provide relatively large capacitance and/or inductance values for applications utilizing DC and/or sub-KHz signals up to RF signals. Embodiments may include an integrated circuit having a substrate having a backside, a substructure formed on the substrate, and a superstructure formed on the substructure and having a metallization layer, the integrated circuit further including at least one backside deep trench capacitor structure including: one or more trenches formed in the backside of the substrate and lined with a first conductive layer, a dielectric, and a second conductive layer; a first electrical connection between the first conductive layer and a first portion of the metallization layer; and a second electrical connection between the second conductive layer and a second portion of the metallization layer. Embodiments may also include an integrated circuit having at least one backside deep trench capacitor structure.

16 Claims, 12 Drawing Sheets

(56)     References Cited

U.S. PATENT DOCUMENTS

| 2017/0186837 A1* | 6/2017 | Yen ........................ H10D 1/047 |
| 2017/0352592 A1 | 12/2017 | Farooq et al. |
| 2019/0393153 A1* | 12/2019 | Wang ............... H01L 21/76898 |
| 2021/0036097 A1* | 2/2021 | Tsai ....................... H10D 1/692 |
| 2022/0165658 A1 | 5/2022 | Mun et al. |
| 2022/0406523 A1* | 12/2022 | Kamgaing ............ H10D 1/716 |
| 2024/0136312 A1* | 4/2024 | Verma .................... H01L 24/16 |
| 2024/0258302 A1* | 8/2024 | Su .......................... H01L 24/08 |

* cited by examiner

_400_

<u>500</u>

_1200_

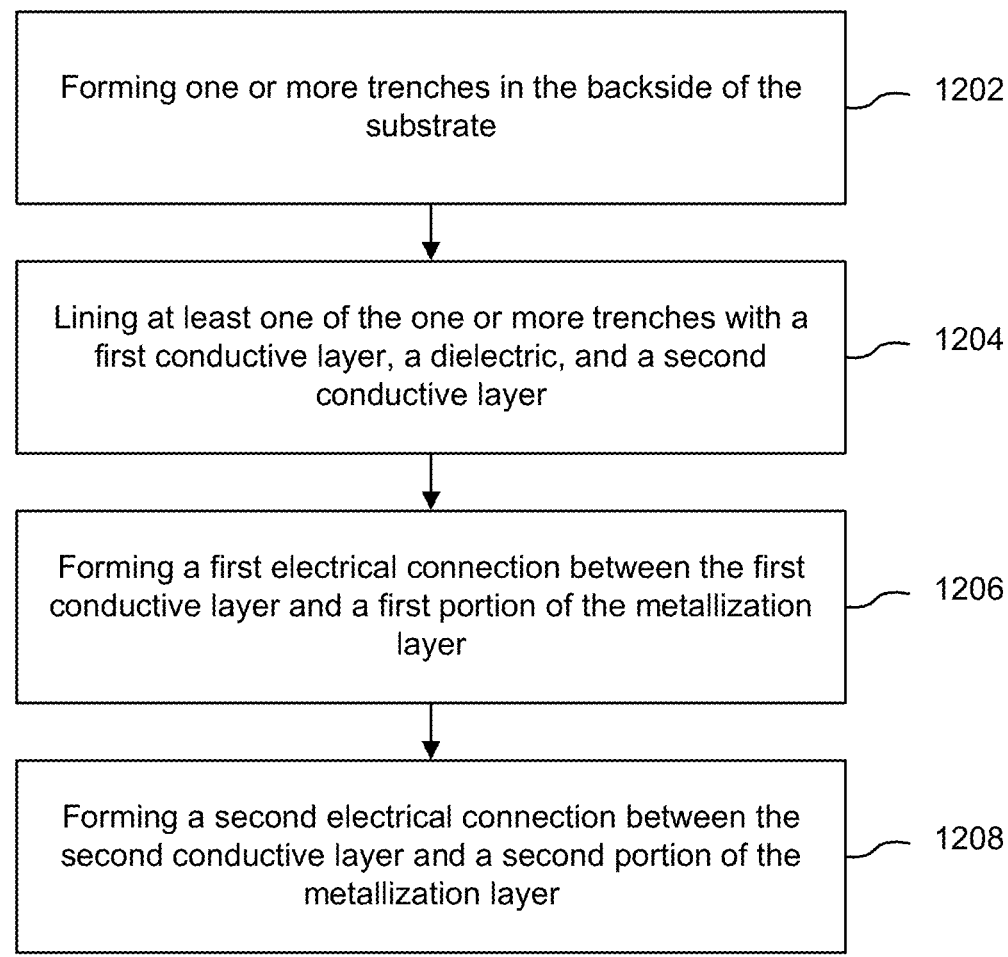

Forming one or more trenches in the backside of the substrate — 1202

Lining at least one of the one or more trenches with a first conductive layer, a dielectric, and a second conductive layer — 1204

Forming a first electrical connection between the first conductive layer and a first portion of the metallization layer — 1206

Forming a second electrical connection between the second conductive layer and a second portion of the metallization layer — 1208

BACKSIDE DEEP TRENCH CAPACITOR AND INDUCTOR STRUCTURES

BACKGROUND

(1) Technical Field

The present invention relates to three-dimensional integrated circuit structures.

(2) Background

The electronics industry continues to strive for ever-increasing electronic functionality and performance in a wide variety of products, including (by way of example only) personal electronics (e.g., "smart" watches and fitness wearables), personal computers, tablet computers, wireless network components, televisions, cable system "set top" boxes, radar systems, and cellular telephones. A concurrent trend is the desire to package such increased functionality and/or performance into smaller sizes. The two-dimensional (2-D) planar form-factor or "footprint" of circuit modules and circuit boards is one constraint on reducing the size of electronic products.

Reducing the size of circuit modules and circuit boards is hampered by the need to accommodate passive components that are made by processes that are incompatible with fabrication of most transistor-based integrated circuits (ICs), particularly CMOS ICs. For example, capacitors and inductors are some of the most commonly used passive components in electronic packaging. For example, capacitors may be used to reduce package electrical impedance and to enable a system to maintain a near-constant voltage across all operating frequencies. Capacitors and inductors may also be used as integral components of signal-handling circuitry (e.g., as part of filters, timing circuits, tuning circuits, impedance matching circuits, charge transfer circuits, etc.).

Many capacitors and inductors are discrete components that are directly mounted on the surface of or within a module substrate or printed circuit board (PCB) near IC chips. A module substrate in turn is often electrically connected to another structure, such as a PCB, which may host multiple module substrates as well as other components. As should be apparent, mounting capacitors and inductors to a module substrate consumes planar area, thus constraining reduction of the size of a module substrate. Further, "off-chip" placement of capacitors and inductors increases undesirable impedances and parasitic capacitances and inductances, a problem that is exacerbated as operational frequencies increase.

A variety of techniques exist for forming "on-chip" capacitors and inductors fully integrated with CMOS IC chips. For example, on-chip capacitors may be made using MIM (metal-insulator-metal), MOM (metal-oxide-metal), and MOS (metal-oxide-semiconductor) processes. However, radio frequency (RF) IC chips intended for ever-smaller products and/or higher functionality (particularly as frequencies are pushed to bands above 5 GHz) require high capacitance densities that such on-chip capacitor techniques cannot achieve for IC dies of a few square millimeters in size at most. For example, current MIM, MOM, and MOS on-chip capacitor techniques deliver capacitance densities measured in a few pico-Farads per square millimeter (pF/mm$^2$) at most, unless expensive and time-consuming (months of fab time) multiple laminations are used (and even then, capacitance density is still relatively low). However, in many applications, capacitance densities need to be measured in micro-Farads per square millimeter (μF/mm$^2$)—that is, about 1,000,000 times greater capacitance than on-chip capacitors can provide. A similar problem affects on-chip inductors. For example, on-chip planar spiral inductors provide limited inductance due to a restricted number of turns possible and also suffer a low Quality (Q) factor while simultaneously requiring relatively large amounts of silicon surface area.

Achieving high capacitance and inductance values using current on-chip techniques requires very large IC dies, which is the antithesis of modern design goals. Accordingly, circuit designs requiring high capacitance and/or inductance values typically use discrete capacitors and inductors as described above, thereby consuming planar area of a mounting structure (e.g., a module substrate or a PCB).

Accordingly, there exists a need in the art for a single-chip solution having much higher capacitance and/or inductance densities than are achievable with current on-chip solutions and which reduces consumption of planar area of a mounting structure. The present invention addresses this need.

SUMMARY

The present invention encompasses single-chip solutions and related methods that result in much higher capacitance and/or inductance densities than are achievable with current on-chip solutions and which reduce consumption of planar area of a mounting structure. Embodiments of the present invention are particularly useful in providing relatively large capacitance and/or inductance values for applications utilizing DC and/or sub-KHz signals up to RF signals. Embodiments provide many orders of magnitude larger capacitive and/or inductance density compared to conventional designs and processes.

Embodiments include an integrated circuit having a substrate having a backside, a substructure formed on the substrate, and a superstructure formed on the substructure and having a metallization layer, the integrated circuit further including at least one backside deep trench capacitor structure including: one or more trenches formed in the backside of the substrate and lined with a first conductive layer, a dielectric, and a second conductive layer; a first electrical connection between the first conductive layer and a first portion of the metallization layer; and a second electrical connection between the second conductive layer and a second portion of the metallization layer.

The details of one or more embodiments of the invention are set forth in the accompanying drawings and the description below. Other features, objects, and advantages of the invention should be apparent from the description and drawings, and from the claims.

DESCRIPTION OF THE DRAWINGS

FIG. 12 is a process flow chart showing a method of making at least one backside deep trench capacitor structure in an integrated circuit having a substrate having a backside, a substructure formed on the substrate, and a superstructure formed on the substructure and having a metallization layer.

Like reference numbers and designations in the various drawings indicate like elements.

DETAILED DESCRIPTION

The present invention encompasses single-chip solutions and related methods that result in much higher capacitance and/or inductance densities than are achievable with current on-chip solutions and which reduce consumption of planar area of a mounting structure. Embodiments of the present invention are particularly useful in providing relatively large capacitance and/or inductance values for applications utilizing DC and/or sub-KHz signals up to RF signals. Embodiments provide many orders of magnitude larger capacitive and/or inductance density compared to conventional designs and processes.

Basic CMOS IC Structure

Figure 1:
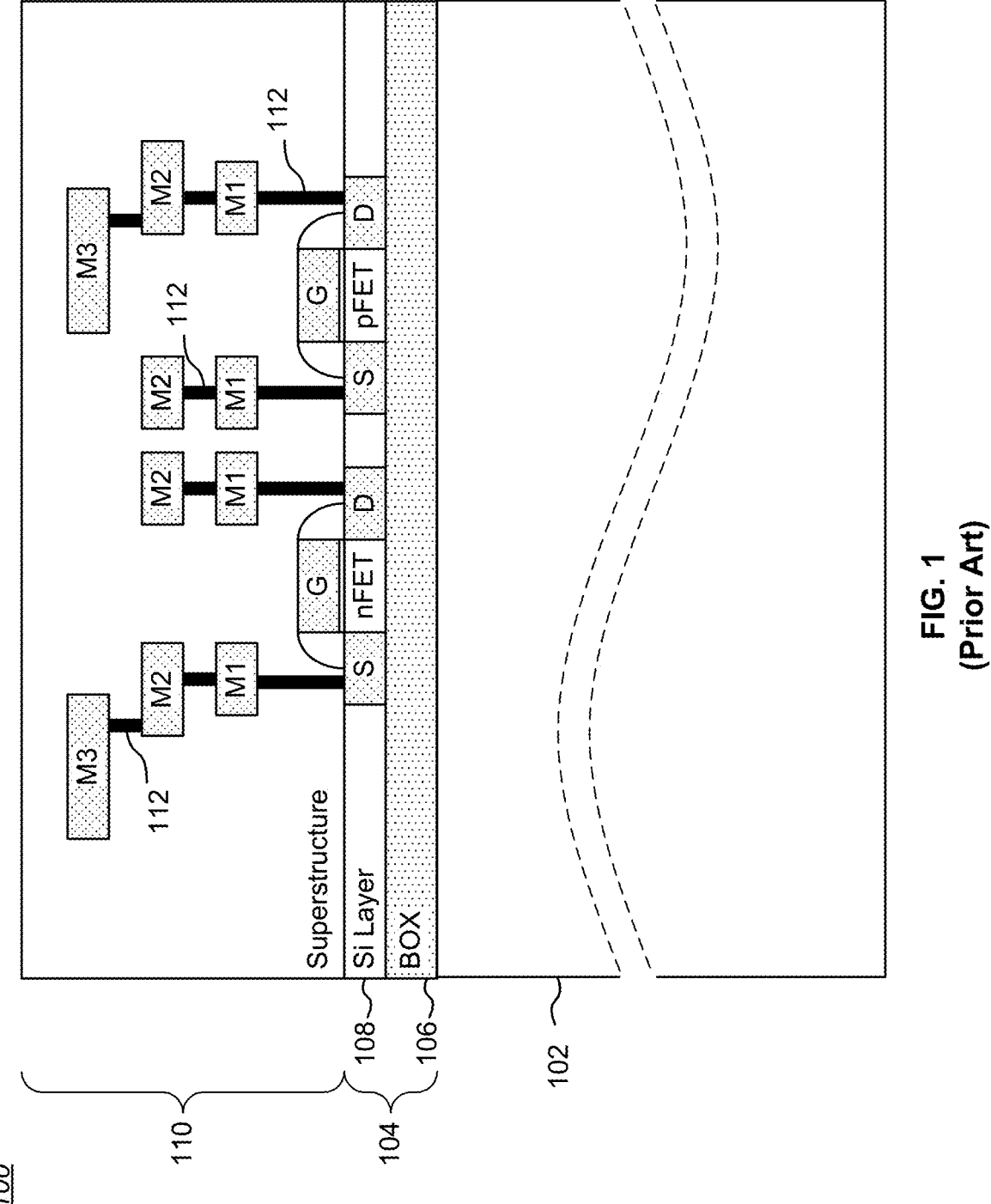
FIG. 1 is a cross-sectional diagram of a prior art silicon-on-insulator (SOI) CMOS integrated circuit (IC).

FIG. 1 is a cross-sectional diagram of a prior art silicon-on-insulator (SOI) CMOS integrated circuit (IC) 100. In the illustrated example, a substrate 102 (e.g., sapphire, trap rich silicon (Si), or high resistivity Si) supports a substructure 104 comprising a buried oxide (BOX) insulator layer 106 which in turn supports an active layer 108.

In the illustrated example, MOSFET transistors (an nFET and a pFET) are formed in and on the active layer 108. Each MOSFET includes a source S, drain D, and an insulated gate G. A superstructure 110 is formed on the active layer 108, and generally comprises inter-layer dielectric (ILD) with one or more layers of conductive material (e.g., metallization layers M1, M2, M3, bonding sites, etc.), and vertical conductors (vias) 112.

The substrate 102 is substantially thicker than the combined substructure 104 and superstructure 110, as indicated by the dashed "break" lines across the illustrated example substrate 102. For example, the substrate 102 may be 10-20 times or more thicker than the combined substructure 104 and superstructure 110.

A MOSFET IC die is essentially formed in two phases: a front-end-of-line (FEOL) phase in which the substructure 104 is formed on the substrate 102, and a back-end-of-line (BEOL) phase in which the superstructure 110 is formed. The FEOL phase may fabricate individual devices (e.g., transistors, resistors, diodes) in or on the active layer 108, while the BEOL phase may fabricate some kinds of components (e.g., on-chip resistors, inductors, and/or capacitors) as well as interconnections between the FEOL devices with conductors formed as part of or spanning one or more conductive layers (e.g., metallization layers M1, M2, M3, etc.). After FEOL and BEOL processing, a wafer undergoes a number of additional known process steps, including dicing, testing, and packaging, to form multiple individual ICs.

Backside Deep Trench Capacitor Structure Examples

Figure 2A:
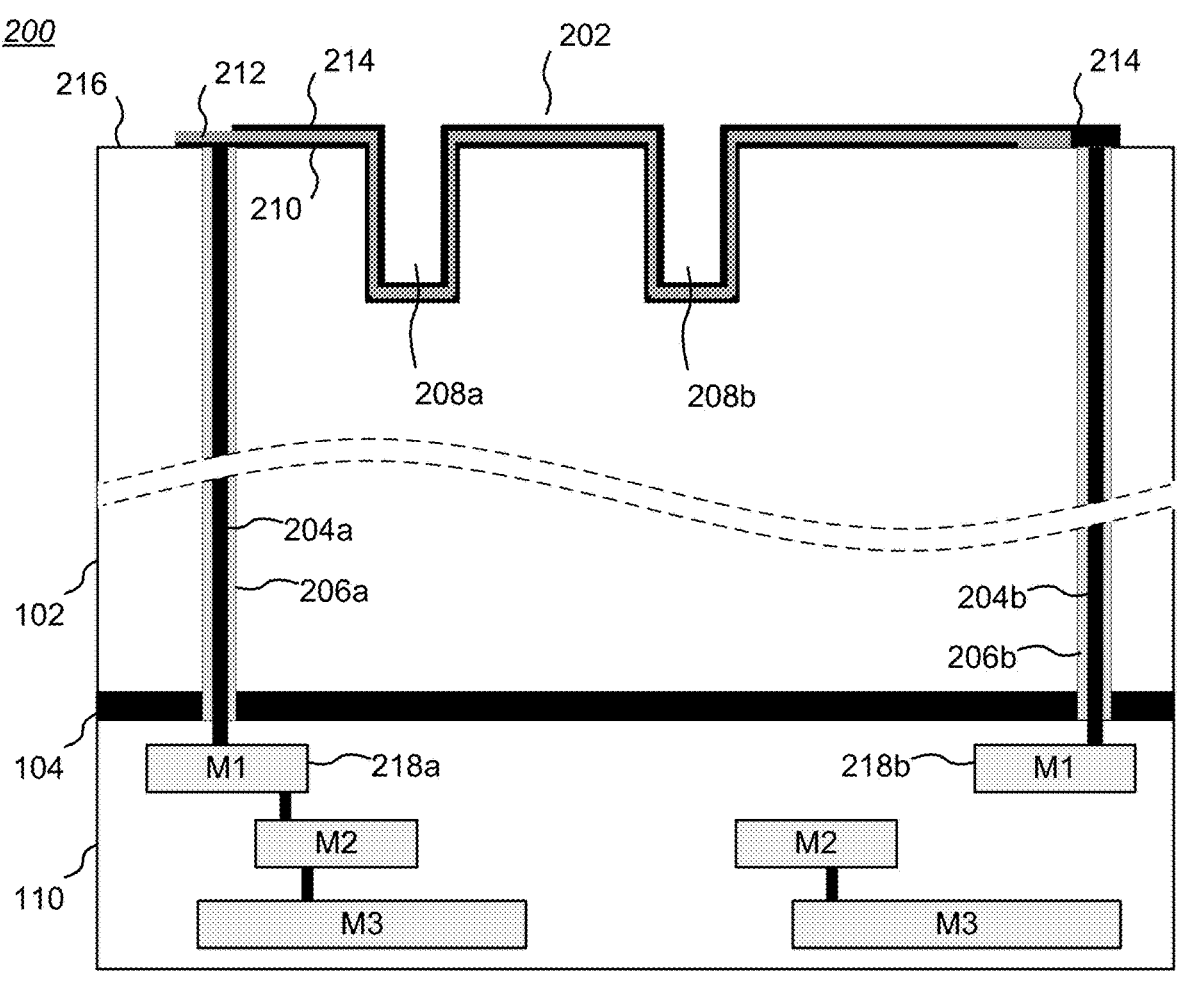
FIG. 2A is a cross-sectional diagram of an SOI IC that includes a first example of a backside deep trench capacitor structure in accordance with the present invention.

FIG. 2A is a cross-sectional diagram of an SOI IC 200 that includes a first example of a backside deep trench capacitor structure 202 in accordance with the present invention. The illustrated IC 200 is upside-down relative to the structure shown in FIG. 1, and thus the substrate 102 is shown on the top and the superstructure 110 is shown on the bottom. The substructure 104 and the superstructure 110 may be made in a conventional fashion on the substrate 102.

In the illustrated example, two through-silicon vias (TSVs) 204a, 204b are formed through the substrate 102. TSVs are vertical electrical connections that passes completely through a silicon wafer or die. In this example, the TSVs 204a. 204b penetrate all of the way from the backside 216 of the substrate 102 to corresponding portions 218a, 218b of the M1 metallization layer. In some cases (particularly when passing through the substructure 104), the shafts through which the TSVs 204a, 204b are formed may be first coated with a dielectric material 206a, 206b (e.g., CVD oxide or any other suitable dielectric). In some embodiments, the TSVs 204a, 204b may penetrate to different metallization layers (e.g., M2, M3), and need not connect to the same metallization layers.

The substrate 102 is also processed to form one or more trenches 208a, 208b, such as by the Metal Assisted Chemical Etching (MACE) process described below. As should be clear, the number of trenches is a design choice, and more or less than the two illustrated two trenches 208a, 208b may be formed. After the trench or trenches 208a, 208b are formed, a first conductive layer 210 (e.g., a metal such as copper or aluminum) is deposited within each trench 208a, 208b, followed by a dielectric 212 (e.g., silicon oxide, silicon nitride, or any other suitable dielectric), followed by a second conductive layer 214. The first conductive layer 210 and one of the TSVs 204a are formed so as to be in electrical contact; accordingly, the first conductive layer 210 can function as a first plate or electrode of the backside deep trench capacitor structure 202 coupled to a first portion 218a of the M1 metallization layer. Similarly, the second conductive layer 214 and one of the TSVs 204b are formed so as to be in electrical contact; accordingly, the second conductive layer 214 can function as a second plate or electrode of the backside deep trench capacitor structure 202 coupled to a second portion 218b of the M1 metallization layer.

Figure 2B:
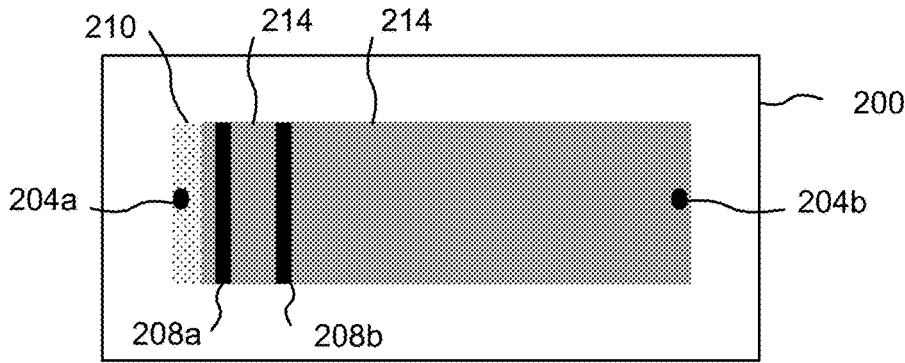
FIG. 2B is a top plan view of the IC of FIG. 2A.

FIG. 2B is a top plan view of the IC 200 of FIG. 2A. The trenches 208a, 208b are shown in a darker shading to differentiate from the portions of the second conductive layer 214 located between the trenches 208a, 208b and from the trench 208b to the corresponding TSV 204b. Similarly, the first conductive layer 210 is shown with a lighter shading to differentiate from the second conductive layer 214.

In FIG. 2B, the trenches 208a, 208b are shown as rectangular slots or trenches. However, the trenches 208a, 208b may have any desired shape, including circular. Conversely, the TSVs 204a, 204b are shown as small slots, nearly circular in shape. However, the TSVs 204a, 204b may have any desired shape, including wide trenches. Accordingly, the surface area of the backside deep trench capacitor structure 202 may be configured to have a wide variety of values, which corresponds to a wide range of capacitance values.

Figure 3:
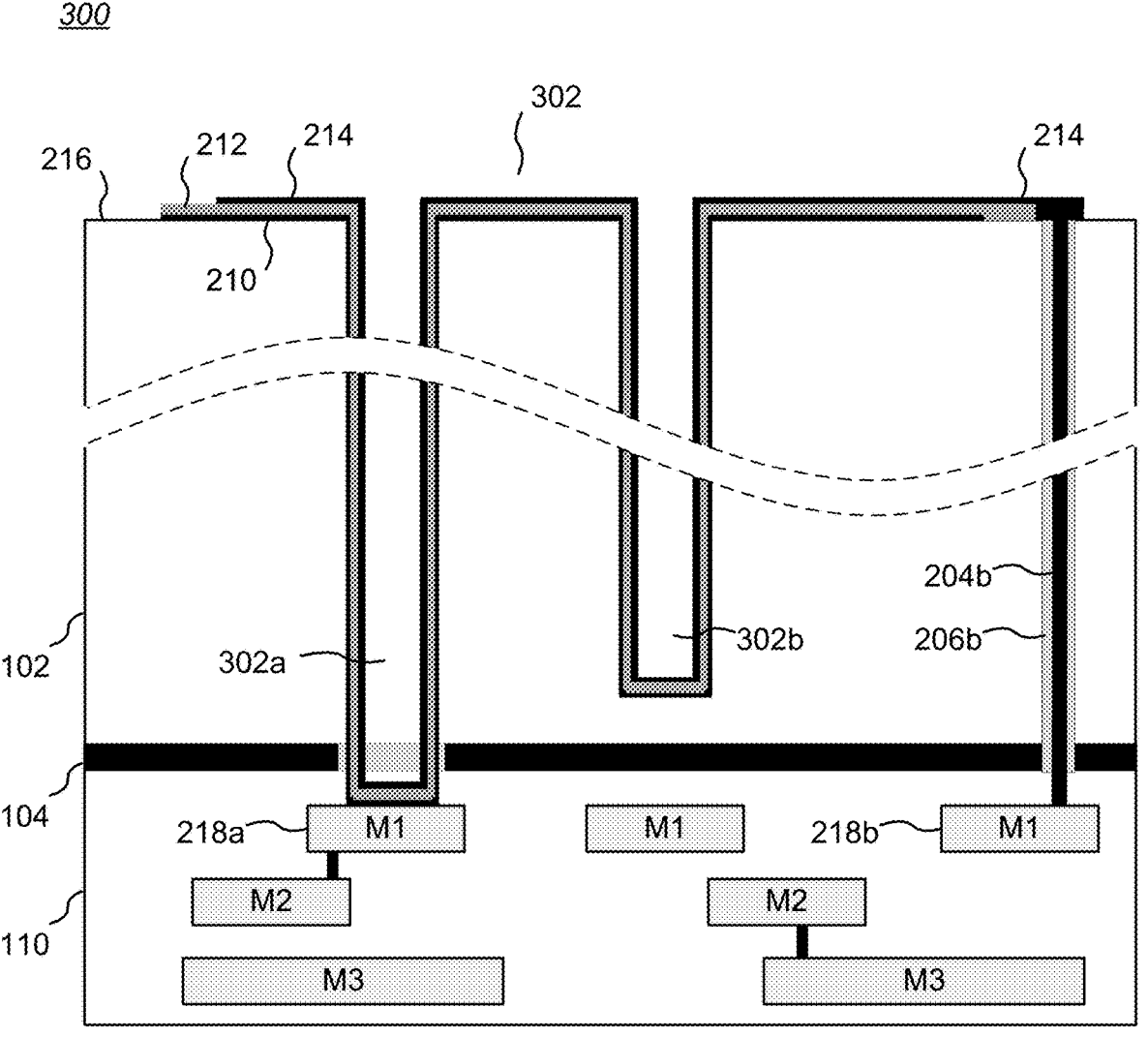
FIG. 3 is a cross-sectional diagram of an SOI IC that includes a second example of a backside deep trench capacitor structure in accordance with the present invention.

FIG. 3 is a cross-sectional diagram of an SOI IC 300 that includes a second example of a backside deep trench capacitor structure 302 in accordance with the present invention. In the illustrated example, one TSV 204b is formed through the substrate 102, penetrating from the backside 216 of the substrate 102 to a corresponding portion 218b of the M1 metallization layer. In some cases (particularly when passing through the substructure 104), the shaft through which the TSV 204b is formed may be first coated with a dielectric material 206b.

The substrate 102 is also processed to form one or more trenches 302a, 302b. As should be clear, the number of trenches is a design choice, and more or less than the two illustrated trenches 302a, 302b may be formed. In the illustrated example, at least one trench 302a penetrates to a corresponding portion 218a of the M1 metallization layer. In some cases (particularly when passing through the substructure 104), the shaft(s) of the at least one trench 302a may be coated with a dielectric material (not shown).

After the trench or trenches 302a, 302b are formed, a first conductive layer 210 is deposited within each trench 302a, 302b, followed by a dielectric 212, followed by a second conductive layer 214. The first conductive layer 210 is formed so as to be in electrical contact with the first portion 218a of the M1 metallization layer; accordingly, the first conductive layer 210 can function as a first plate or electrode of the backside deep trench capacitor structure 302. Similarly, the second conductive layer 214 and one of the TSVs 204b are formed so as to be in electrical contact; accordingly, the second conductive layer 214 can function as a second plate or electrode of the backside deep trench capacitor structure 202 coupled to a second portion 218b of the M1 metallization layer.

Figure 4:
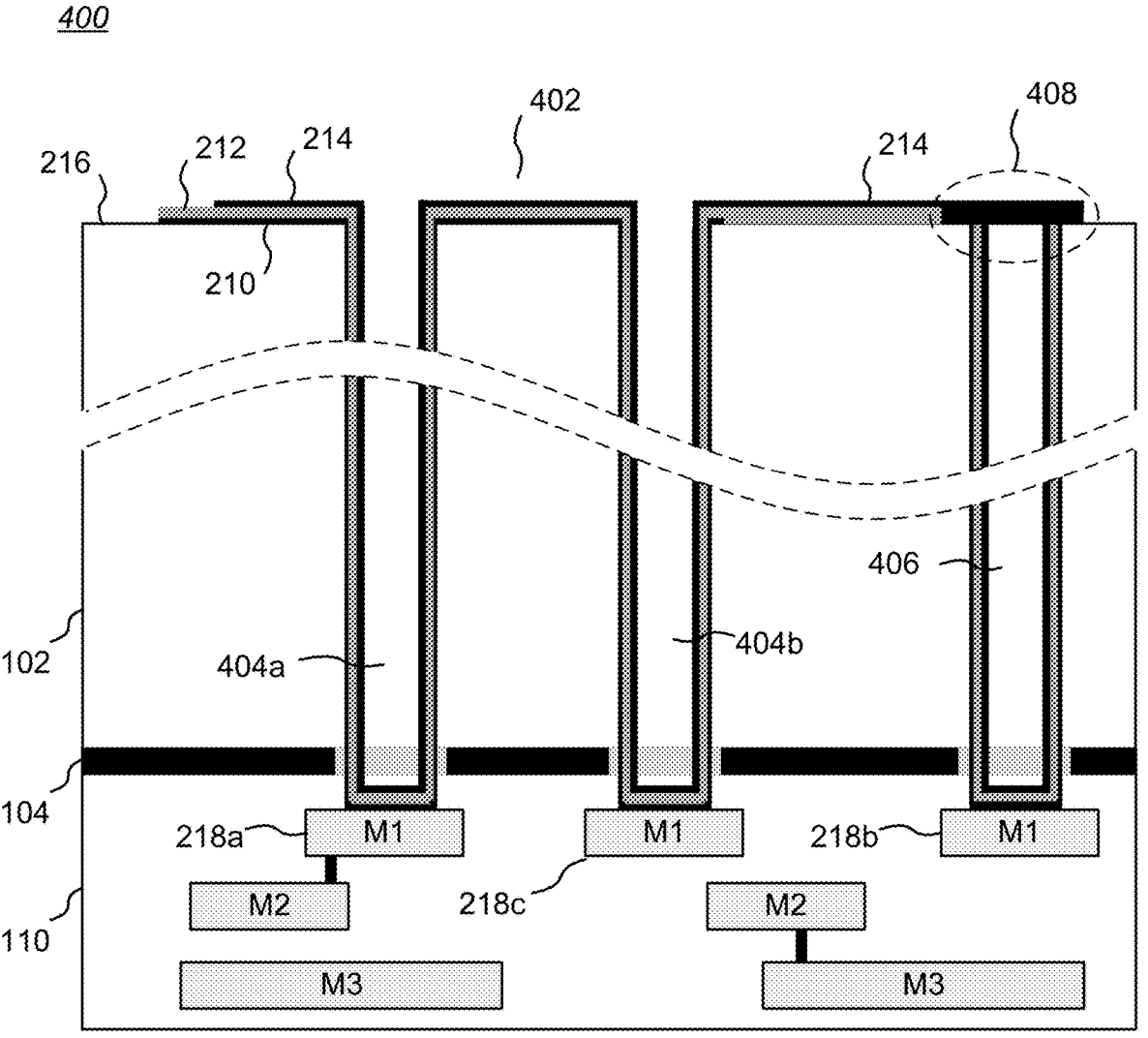
FIG. 4 is a cross-sectional diagram of an SOI IC that includes a third example of a backside deep trench capacitor structure in accordance with the present invention.

FIG. 4 is a cross-sectional diagram of an SOI IC 400 that includes a third example of a backside deep trench capacitor structure 402 in accordance with the present invention. In the illustrated example, TSVs are not used to connect the backside deep trench capacitor structure 402 to a metallization layer. Instead, trench structures make all contacts to corresponding portions of the M1 metallization layer, with one of the trench structures being electrically-shorted so as to function simply as an electrical contact.

For example, in FIG. 4, two trenches 404a, 404b are formed so as to penetrate the substrate 102 to corresponding portions 218a, 218c of the M1 metallization layer (and thus will ultimately constitute two parallel capacitors). As should be clear, the number of trenches is a design choice, and more or less than the two illustrated two trenches 404a, 404b may be formed. The same trench-forming process is used to form a capped connector trench 406 penetrating from the backside 216 of the substrate 102 to a corresponding portion 218b of the M1 metallization layer. As in the example of FIG. 3, after the trenches 404a, 404b, 406 are formed, a first conductive layer 210 is deposited within each trench, followed by a dielectric 212, followed by a second conductive layer 214.

Additionally, the second conductive layer 214 is formed over the capped connector trench 406, thus shorting the first conductive layer 210 and the second conductive layer 214 (see dashed oval 408). Accordingly, the capped connector trench 406 behaves as an electrical conductor—and not as a capacitor—coupling the second conductive layer 214 with the second portion 218b of the M1 metallization layer.

Figure 5:
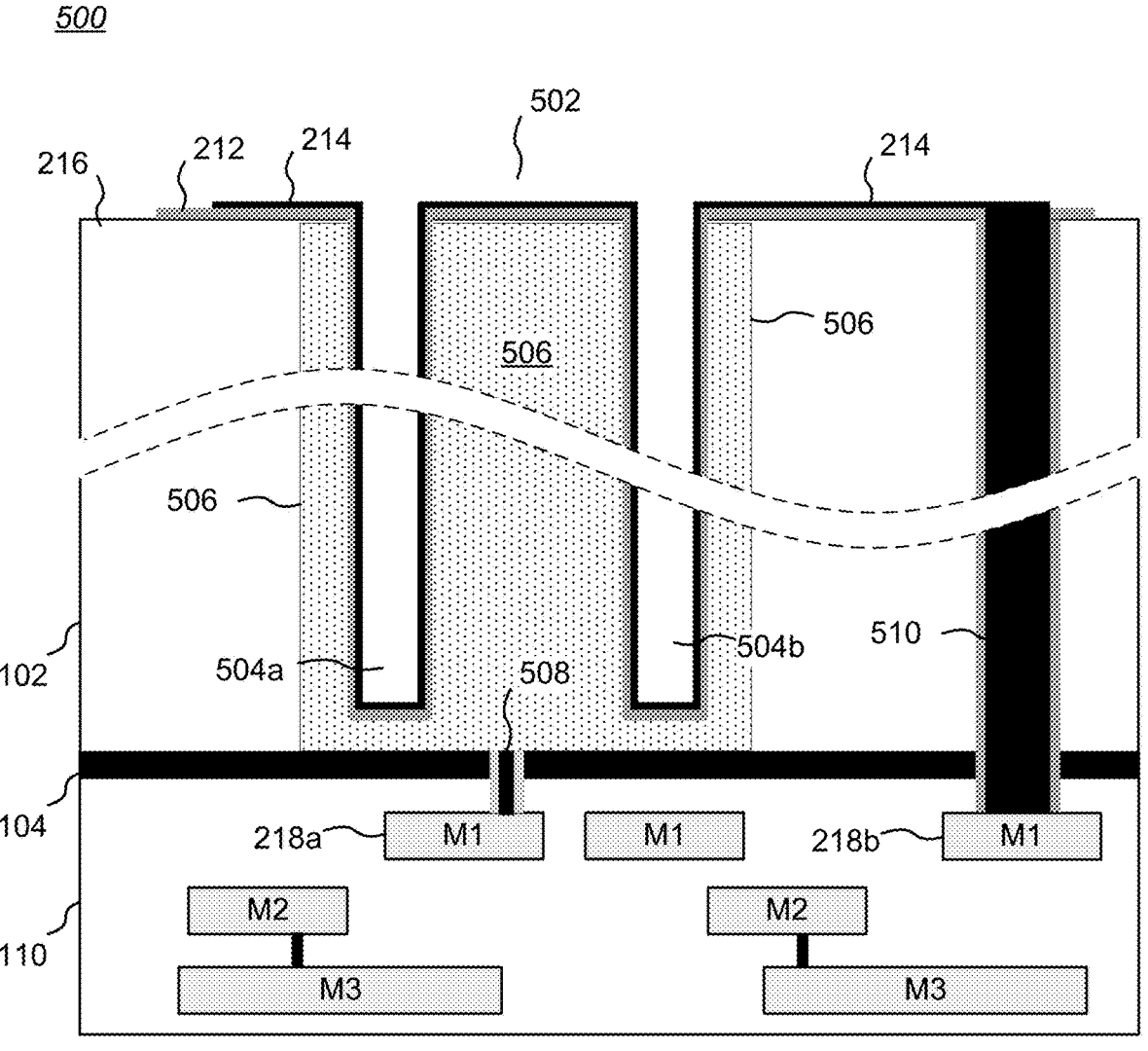
FIG. 5 is a cross-sectional diagram of an SOI IC that includes a fourth example of a backside deep trench capacitor structure in accordance with the present invention.

FIG. 5 is a cross-sectional diagram of an SOI IC 500 that includes a fourth example of a backside deep trench capacitor structure 502 in accordance with the present invention. In the illustrated example, a conductive region of the substrate 102 provides a first electrode of the backside deep trench capacitor structure 502, and a connector trench structure connects the second electrode to a corresponding portion of the M1 metallization layer.

For example, in FIG. 5, two trenches 504a, 504b are formed within the substrate 102. The substrate 102 may be naturally conductive or semi-conductive, or a region 506 around the trenches 504a, 504b may be suitably doped (before or after making the trenches) to make that region conductive or semi-conductive. A via 508 may also be formed to connect the region 506 to a corresponding portion 218a of one of the metallization layers (M1 in this example). Accordingly, the region 506 can function as a first plate or electrode of the backside deep trench capacitor structure 502.

The same trench-forming process is used to form a connector trench 510 penetrating from the backside 216 of the substrate 102 to a corresponding portion 218b of the M1 metallization layer. The connector trench 510 may be regarded as a type of TSV. An exemplary method for creating trenches/vias of different depths may include: applying a two-masking step process where the first step is masking the surface and opening a first area to etch the first type of via, and the second step is covering the surface and opening a second area to etch the second type of via. This process can be repeated or iterated to generate as many vias as needed with n number of depths, where n is a positive integer.

After the trench or trenches 504a, 504b, 510 are formed, a dielectric 212 is deposited within each trench, followed by a second conductive layer 214. The second conductive layer 214 within the connector trench 510 may completely fill that trench, as shown, or just line that trench. The second conductive layer 214 is formed so as to be in electrical contact with the corresponding portion 218b of the M1 metallization layer; accordingly, the second conductive layer 214 can function as a second plate or electrode of the backside deep trench capacitor structure 502.

Figure 6:
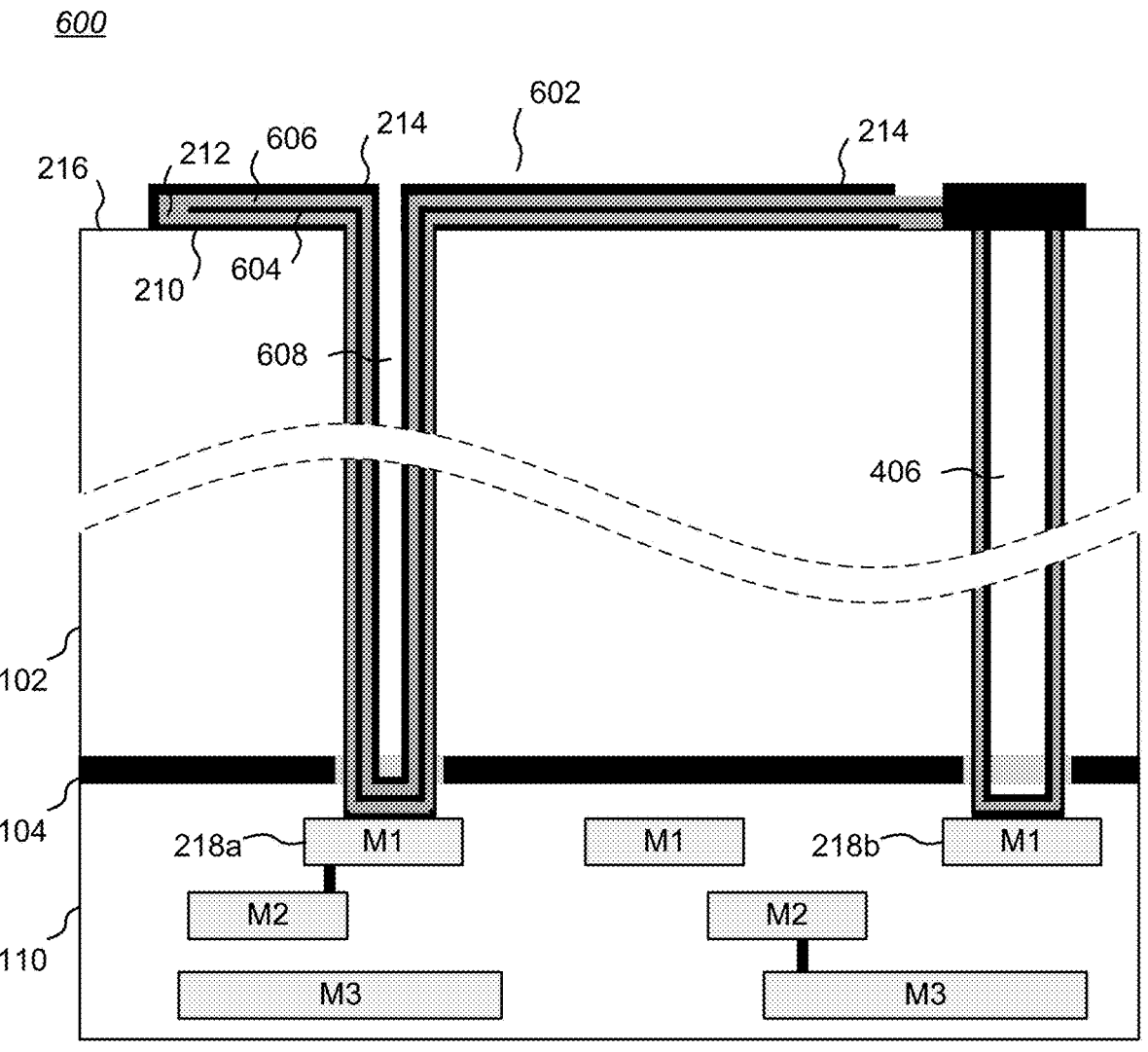
FIG. 6 is a cross-sectional diagram of an SOI IC that includes a fifth example of a backside deep trench capacitor structure in accordance with the present invention.

FIG. 6 is a cross-sectional diagram of an SOI IC 600 that includes a fifth example of a backside deep trench capacitor structure 602 in accordance with the present invention. The illustrated example is similar to the backside deep trench capacitor structure 402 of FIG. 4, but includes one or more additional intermediate conductive electrodes 604 and corresponding dielectric layers 606 formed within a capacitor trench 608 (one such pair of electrodes 604 and dielectric layers 606 are shown in FIG. 6). The additional intermediate conductive electrodes 604 enable stacks of positive and negative terminals for the capacitor backside deep trench capacitor structure 602 to further increase capacitive density. In the illustrated example, one intermediate conductive electrode 604 is electrically coupled to a corresponding portion 218b of the M1 metallization layer. Conductive electrodes 214 and 210, which "sandwich" intermediate conductive electrode 604, are shorted together and electrically coupled to a corresponding portion 218a of the M1 metallization layer. It should be appreciated that multiple stacked conductive electrodes may be formed in a similar manner, depending on the amount of capacitance density to be achieved.

Backside Deep Trench Inductor Structure Examples

Figure 7A:
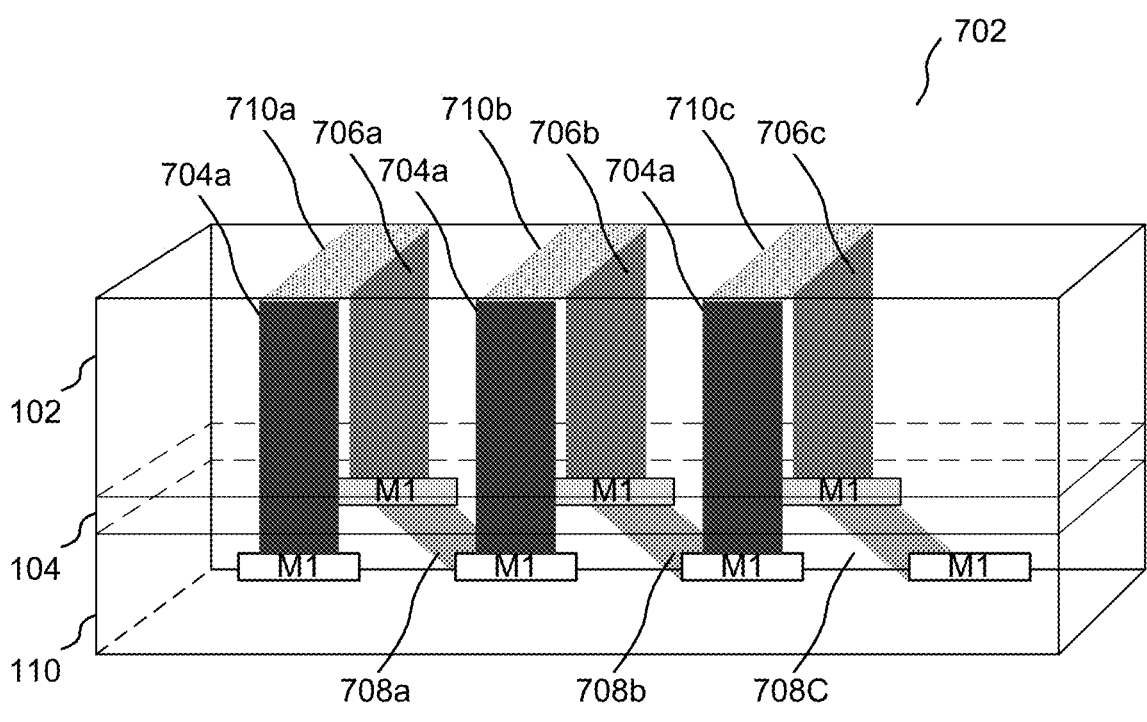
FIG. 7A is a perspective diagram of an SOI IC that includes a first example of a backside deep trench inductor structure in accordance with the present invention.
Figure 7B:
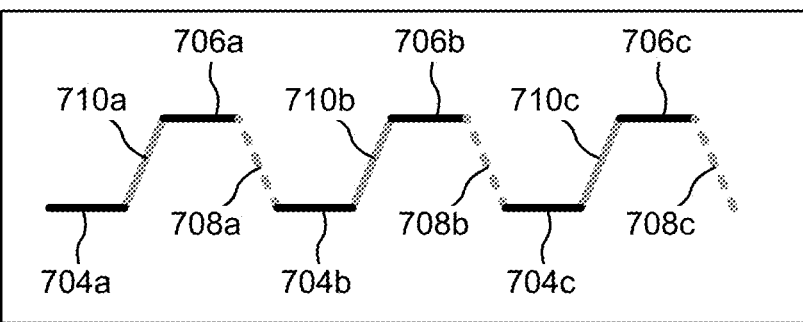
FIG. 7B is a top plan view of FIG. 7A, showing some elements in a dashed-line phantom view.

The techniques described above may be used to create inductor structures as well. For example, FIG. 7A is a perspective diagram of an SOI IC 200 that includes a first example of a backside deep trench inductor structure 702 in accordance with the present invention. FIG. 7B is a top plan view of FIG. 7A, showing some elements in a dashed-line phantom view.

In the illustrated example, a set of parallel offset conductive trenches 704a-704c and 706b-706c are formed so as to connect from the backside 216 of the substrate 102 to corresponding portions of the M1 metallization layer within the superstructure 110. Pairs of those portions of the M1 metallization layer are connected through extents 708a-708c of the M1 metallization layer. Similarly, backside conductive extents 710a-710c (shown in a contrasting shading) are formed on the backside of the substrate 102 to connect pairs of the conductive trenches 704a-704c and 706b-706c.

Accordingly, a continuous coil of conductive material—an inductor—is formed by the conductive trenches 704a-704c and 706b-706c, the M1 metallization layer extents 708a-708c, and the backside conductive extents 710a-710c. Note that a dielectric layer (not shown) may be used to separate the first conductive layer 210 from the active silicon of the substructure 104. For an IC having a thickness in the range of 20-100 μm or more, the resulting inductor should have a relatively high Q factor.

A single IC may include one or more backside deep trench capacitor structures and one or more backside deep trench inductor structures.

Fabrication Considerations

For all of the example embodiments described above, the trenches (including connector trenches) and TSVs may be formed in the original substrate 102, or through a thinned version of the original substrate 102. For example, the original substrate 102 may be about 700-800 μm thick (before any thinning). For a variety of reasons, including final IC height constraints and heat dissipation, it may be desirable to thin the original substrate 102 so that the combined height of the superstructure 110, substruction 104, and substrate 102 is about 100-200 μm in thickness. Thinning of the substrate 102 may be accomplished, for example, by means of mechanical grinding or chemical mechanical polishing (CMP).

Figures 8A, 8B:
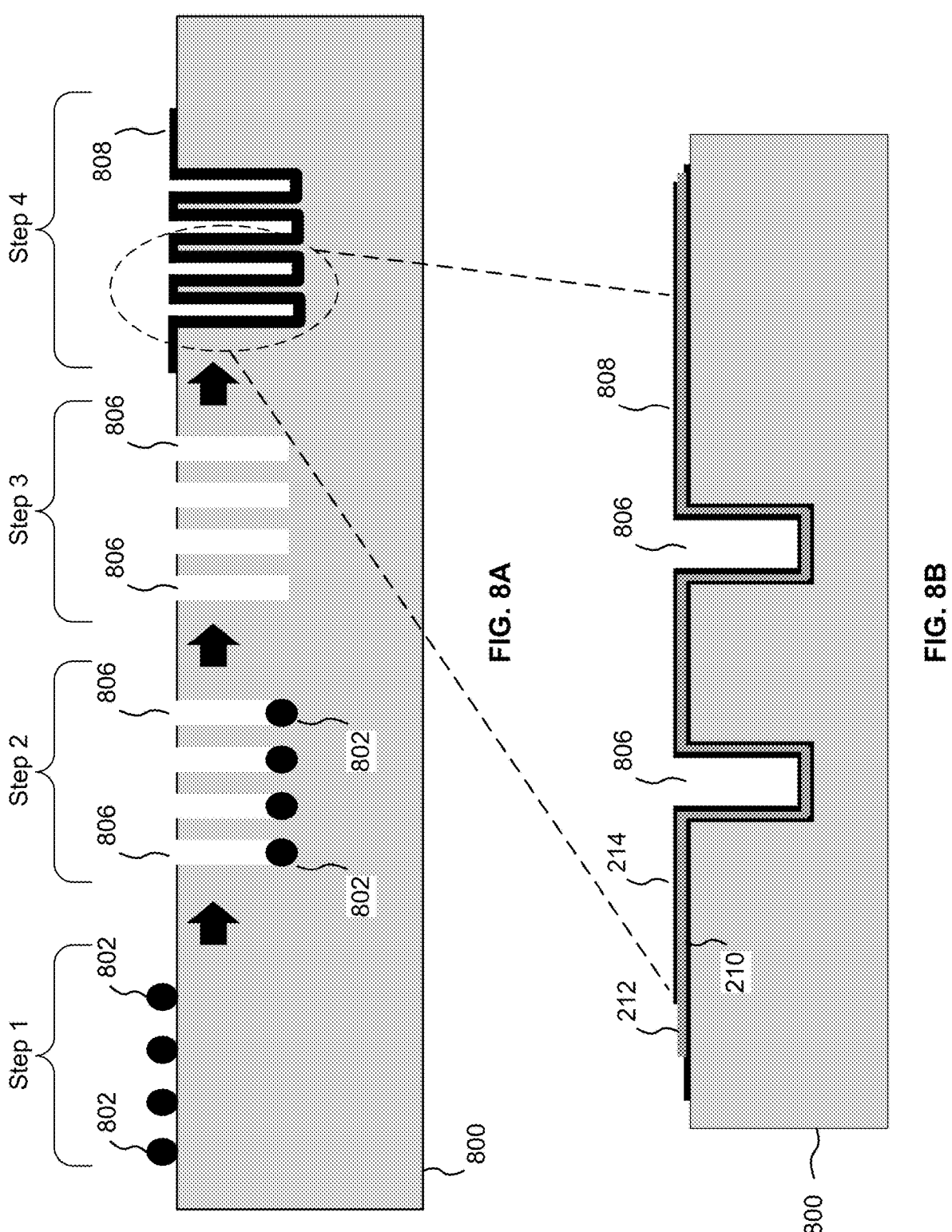
FIG. 8A shows a sequence of steps for one embodiment of the MACE process.
FIG. 8B is an enlarged version of the structure resulting from STEP 4 of FIG. 8A.

The trenches (including connector trenches) may be fabricated in a number of ways. For example, FIG. 8A shows a sequence of steps for one embodiment of the MACE process. The MACE process involves wet chemical etching of semiconductors (mainly silicon) with the use of a metal catalyst. For example, a metal catalyst may be deposited on the surface of a silicon substrate 800 in the form of nanoparticles 802 (STEP 1). The silicon substrate 800 is then subjected to an etching solution that enables the deposited metal catalyst nanoparticles 802 to dissolve the silicon, forming pores or trenches 806 containing the nanoparticles 802 (STEP 2). The nanoparticles 802 may then be dissolved, leaving just the pores or trenches 806 (STEP 3). The pores or trenches 806 may then be processed as described above to form a backside deep trench capacitor structure 808, as described above (STEP 4). FIG. 8B is an enlarged version of the structure resulting from STEP 4 of FIG. 8A. The illustrated example shows a first conductive layer 210, followed by a dielectric 212, followed by a second conductive layer 214.

Alternative processes for fabricating the trenches (including connector trenches) may include deep trench etching, deep reactive-ion etching (e.g., Bosch etching, a high-aspect ratio plasma etching process), wet etching, and porousization followed by a tetramethylammonium hydroxide (TMAH) or potassium hydroxide (KOH) vapor etch. In some cases, an etching step may require an etch stop layer at the end to prevent damage to a connection layer (e.g., an associated portion of M1).

TSVs may be fabricated in a number of ways. "Via-first" TSVs are fabricated before individual devices (transistors, capacitors, resistors, etc.) are patterned during FEOL processing. "Via-middle" TSVs are fabricated during FEOL processing after the individual devices are patterned but before BEOL processing. "Via-last" TSVs are fabricated as part of BEOL processing.

It may be advantageous to form backside deep trench capacitor and/or inductor structures after FEOL processing. Currently, most of the high-density integrated capacitor processes (MIM, MOM, MOS) take place at the fab before or right after FEOL processing. However, the processing steps for forming trenches (including connector trenches) may be performed at a later stage of processing, including during BEOL processing or outsourced semiconductor assembly and test (OSAT) processing, which often will save money, simplify process flow, and improve the overall efficiency of fabrication by not needing to form backside deep trenches in-line at a CMOS fab—thus, a CMOS fab does not need the capabilities required for backside deep trench formation. Post-FEOL processing may also save die area because FEOL space is not consumed by the novel backside deep trench capacitor and/or inductor structures.

Post-FEOL processing to form backside deep trench capacitor and/or inductor structures is also advantageous if the substrate 102 has been thinned. Thinned substrate wafers may be fragile. Typically, in a 2-dimensional IC process flow, a thinned substrate wafer is singulated (diced) and individual IC dies are mounted on a reel of tape. The tape may then be sent to OSAT processing where the IC dies are picked from the tape and then placed on and attached to another structure, such as an interposer or laminate.

Figures 9, 10:
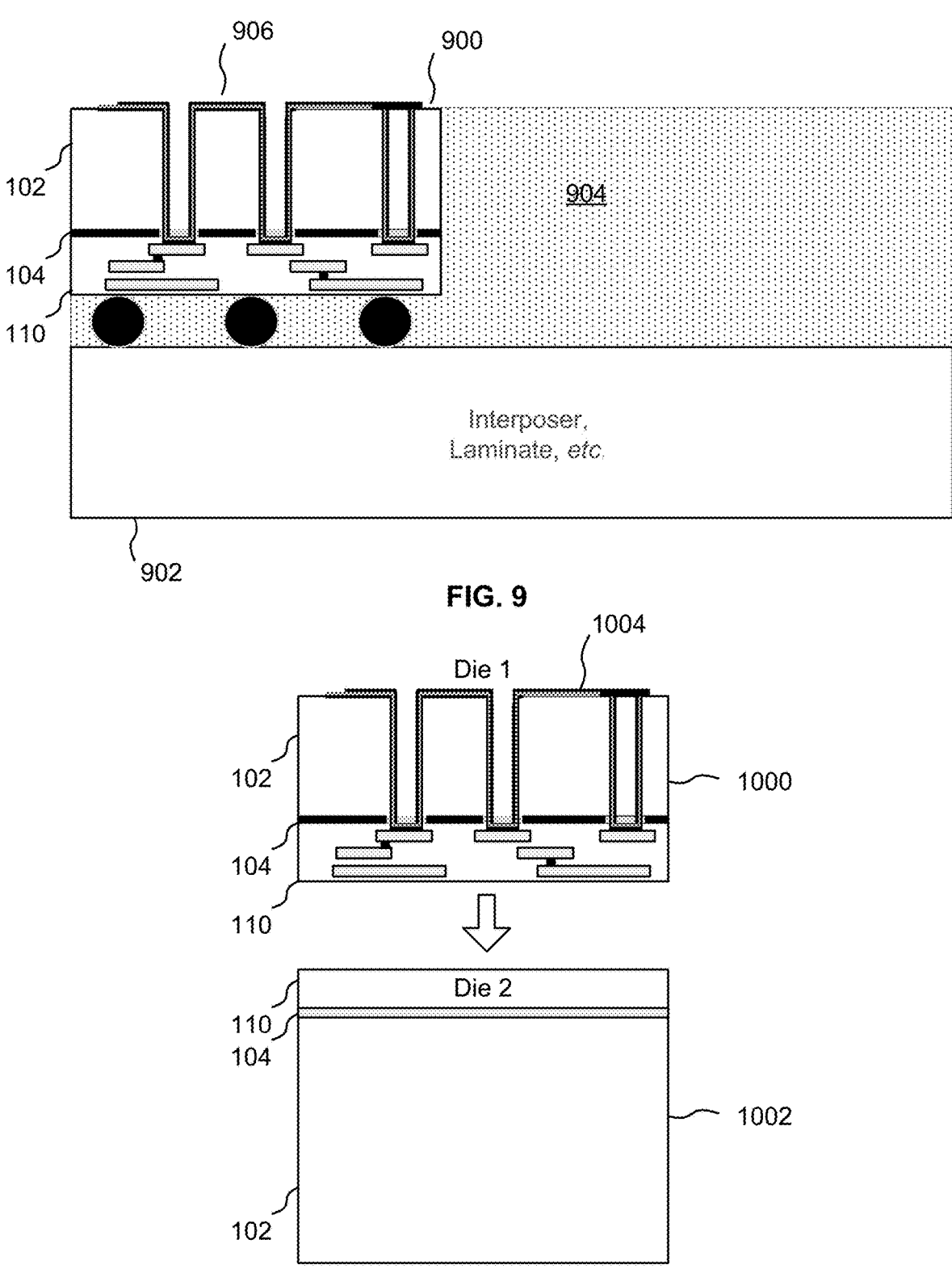
FIG. 9 is a cross-sectional diagram of an IC die mounted on another structure, such as an interposer or laminate, and surrounded by fill material (e.g., epoxy).
FIG. 10 is a cross-sectional diagram of a first IC die being mounted onto a second IC die as part of a typical 3-dimensional IC process flow.

For example, FIG. 9 is a cross-sectional diagram of an IC die 900 mounted on another structure 902, such as an interposer or laminate, and surrounded by fill material 904 (e.g., epoxy). While the illustration shows the IC die 900 as including a backside deep trench capacitor structure 906, the IC die 900 may include a backside deep trench inductor structure. Further, it should be understood that a typical post-FEOL processing sequence in accordance with the present invention would be: (1) pick-and-place an IC die 900 (not having a backside deep trench capacitor or inductor structure) on the other structure 902 (interposer, laminate, etc.) so as to provide a suitably strong (less fragile) unit to work with in subsequent processing steps, (2) optionally surround the IC die 900 with fill material 904, and (3) subject the IC die 900 to one of the backside deep trench capacitor and/or inductor structure processes described above. After such processing, the unit structure (IC die 900 and other structure 902) may be attached or connected to other circuit structures (e.g., a PCB).

FIG. 9 describes part of a typical 2-dimensional IC process flow. FIG. 10 is a cross-sectional diagram of a first IC die 1000 being mounted onto a second IC die 1002 as part of a typical 3-dimensional IC process flow. While the illustration shows the first IC die 1000 as including a backside deep trench capacitor structure 1004, the first IC die 1000 may include a backside deep trench inductor structure. Further, it should be understood that a typical post-FEOL processing sequence in accordance with the present invention would be: (1) pick-and-place a first IC die 1000 (not having a backside deep trench capacitor or inductor structure) on a second IC die 1002 so as to provide a suitably strong (less fragile) unit to work with in subsequent processing steps, and (2) subject the first IC die 1000 to one of the backside deep trench capacitor and/or inductor structure processes described above. After such processing, the unit structure (first IC die 1000 and second IC die 1002) may be further processed to result in 3-dimensional circuit units that may be attached or connected to other circuit structures (e.g., a circuit module or PCB). Note that the first IC die 1000 may be attached to the second IC die 1002 using die-to-die bonding, or using die-to-wafer bonding (i.e., the second IC die 1002 is part of an unsingulated wafer), or using wafer-to-wafer bonding (i.e., both the first IC die 1000 and the second IC die 1002 are each part of a corresponding unsingulated wafer, or, in the case of the first IC die 1000, the first IC die 1000 is part of a reconstituted wafer mounting multiple ICs).

Circuit Embodiments

Circuits and devices in accordance with the present invention may be used alone or in combination with other components, circuits, and devices. IC embodiments of the present invention may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 11:
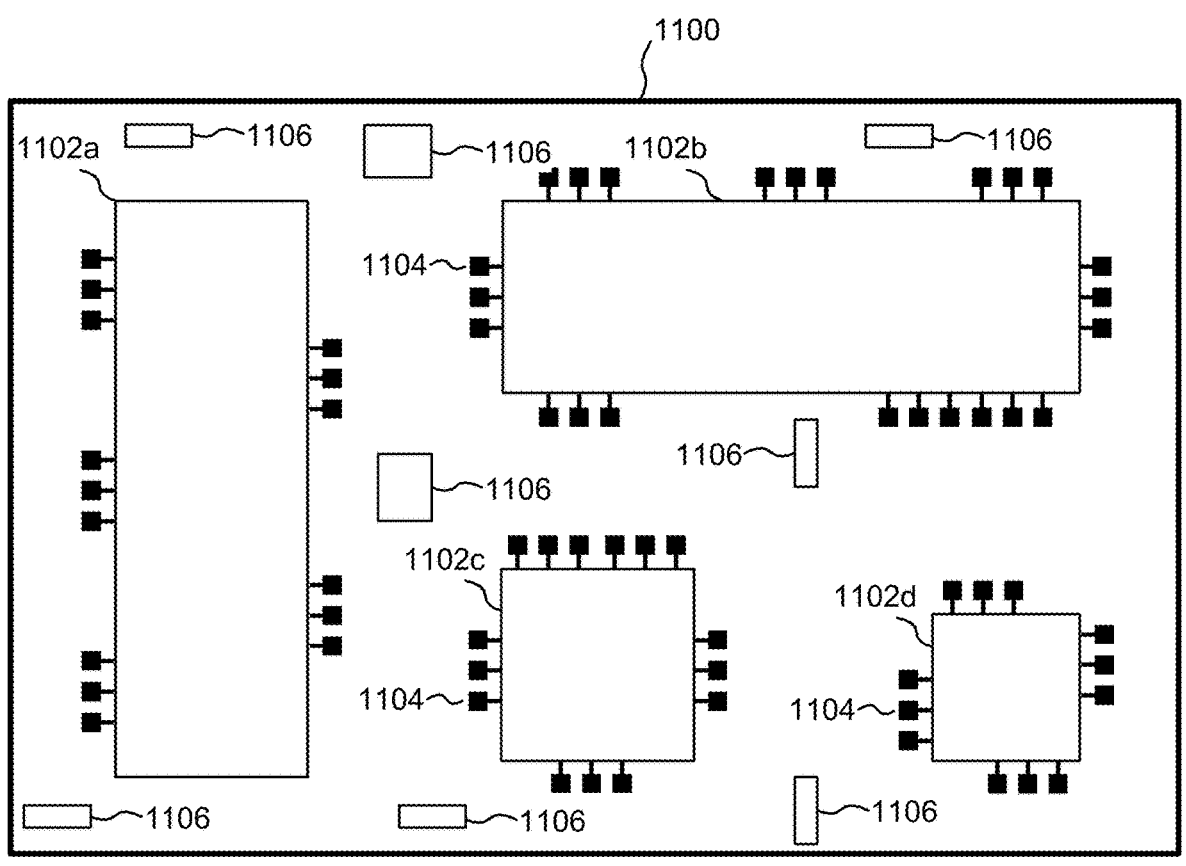
FIG. 11 is a top plan view of a multi-IC substrate that may be, for example, a printed circuit board or chip module substrate (e.g., a thin-film tile).

As one example of further integration of embodiments of the present invention with other components, FIG. 11 is a top plan view of a multi-IC substrate 1100 that may be, for example, a printed circuit board or chip module substrate (e.g., a thin-film tile). In the illustrated example, the substrate 1100 includes multiple ICs 1102a-1102d having terminal pads 1104 which would be interconnected by conductive vias and/or traces on and/or within the substrate 1100 or on the opposite (back) surface of the substrate 1100 (to avoid clutter, the surface conductive traces are not shown and not all terminal pads are labelled). The ICs 1102a-1102d may embody, for example, signal switches, active filters, amplifiers (including one or more LNAs), and other circuitry. For example, IC 1102b may be one or more instances of an IC chip module having one or more backside deep trench capacitor and/or inductor structures.

The substrate 1100 may also include one or more passive devices 1106 embedded in, formed on, and/or affixed to the substrate 1100. While shown as generic rectangles, the passive devices 1106 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 1100 to other passive devices 1106 and/or the individual ICs 1102a-1102d. The front or back surface of the substrate 1100 may be used as a location for the formation of other structures.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G New Radio, 6G, and WiFi (e.g., 802.11a, b, g, ac, ax, be) protocols, as well as other radio communication standards and protocols.

Methods

Another aspect of the invention includes methods of making at least one backside deep trench capacitor or inductor structures in an integrated circuit.

For example, FIG. 12 is a process flow chart 1200 showing a method of making at least one backside deep trench capacitor structure in an integrated circuit having a substrate having a backside, a substructure formed on the substrate, and a superstructure formed on the substructure and having a metallization layer. The method includes: forming one or more trenches in the backside of the substrate (Block 1202); lining at least one of the one or more trenches with a first conductive layer, a dielectric, and a second conductive layer (Block 1204); forming a first electrical connection between the first conductive layer and a first portion of the metallization layer (Block 1206); and forming a second electrical connection between the second conductive layer and a second portion of the metallization layer (Block 1208).

Additional aspects of the above method may include one or more of the following: wherein at least one of the first electrical connection or the second electrical connection is a through-silicon via; wherein at least one of the one or more trenches is formed from the backside of the substrate and through the substrate to the first portion of the metallization layer; forming the second electrical connection as a capped connector trench; wherein the first conductive layer includes a conductive region of the substrate around at least one of the one or more trenches; forming the second electrical connection as a connector trench; mounting the integrated circuit on another structure before making the at least one backside deep trench capacitor structure; wherein the other structure is one of an interposer or laminate; and/or wherein the other structure a second integrated circuit.

Figure 13:
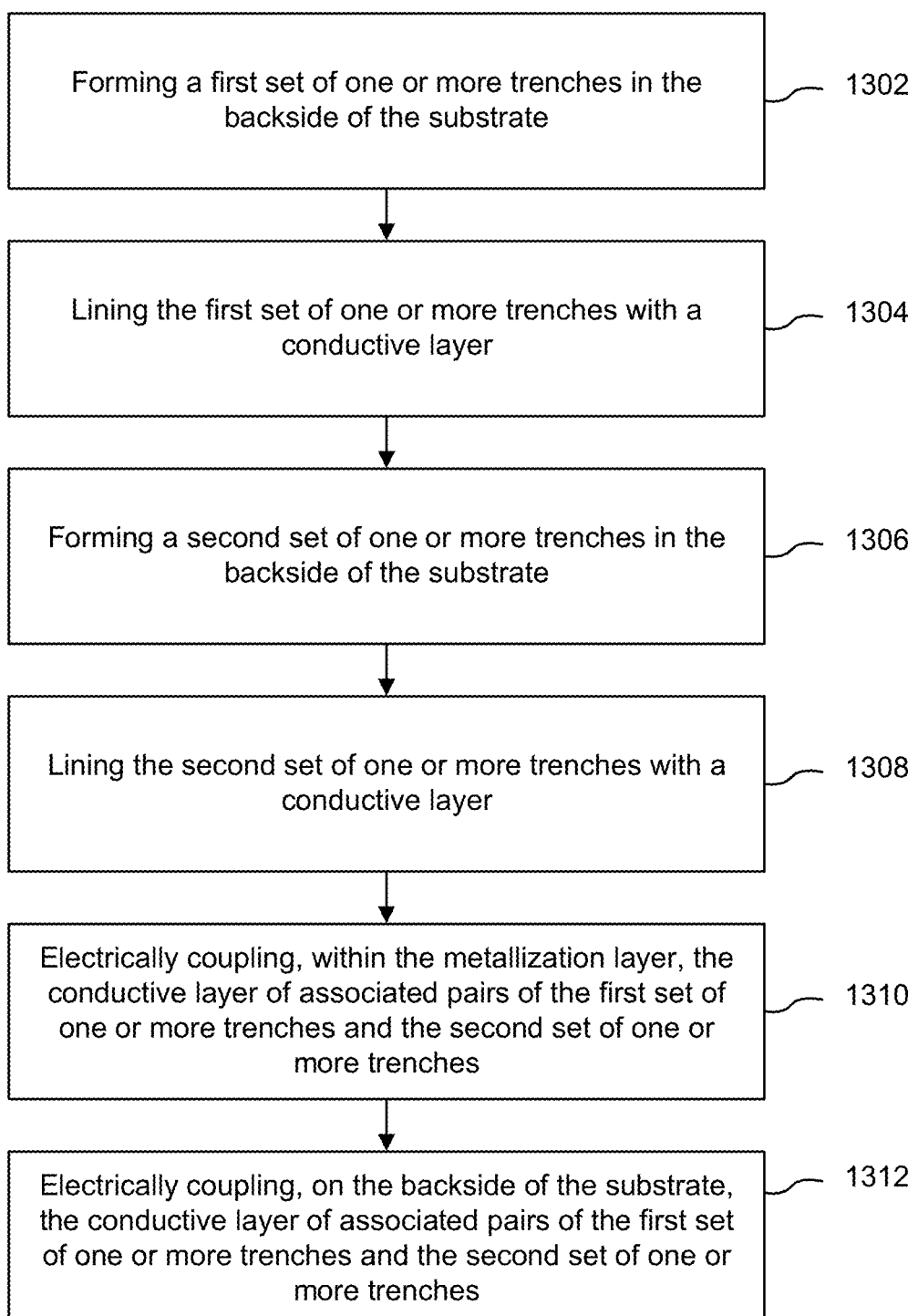
FIG. 13 is a process flow chart showing a method of making at least one backside deep trench inductor structure in an integrated circuit having a substrate having a backside, a substructure formed on the substrate, and a superstructure formed on the substructure and having a metallization layer.

As another example, FIG. 13 is a process flow chart 1300 showing a method of making at least one backside deep trench inductor structure in an integrated circuit having a substrate having a backside, a substructure formed on the substrate, and a superstructure formed on the substructure and having a metallization layer. The method includes: forming a first set of one or more trenches in the backside of the substrate (Block 1302); lining the first set of one or more trenches with a conductive layer (Block 1304); forming a second set of one or more trenches in the backside of the substrate (Block 1306); lining the second set of one or more trenches with a conductive layer (Block 1308); electrically coupling, within the metallization layer, the conductive layer of associated pairs of the first set of one or more trenches and the second set of one or more trenches (Block 1310); and electrically coupling, on the backside of the substrate, the conductive layer of associated pairs of the first set of one or more trenches and the second set of one or more trenches (Block 1312); wherein the coupled conductive layers of the first set of one or more trenches and the second set of one or more trenches form a continuous coil of conductive material. As should be clear, the steps shown in Blocks 1302 and 1306 may be done concurrently. Similarly, the steps shown in Blocks 1304 and 1308 may be done concurrently.

Additional aspects of the above method may include one or more of the following: mounting the integrated circuit on another structure before making the at least one backside deep trench capacitor structure; wherein the other structure is one of an interposer or laminate; and/or wherein the other structure a second integrated circuit.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other tran-sistor technologies, such as bipolar junction transistors (BJTs), BiCMOS, LDMOS, BCD, GaAs HBT, GaN HEMT, GaAs pHEMT, MESFET, InP HBT, InP HEMT, FinFET, GAAFET, and SiC-based power device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit including a substrate having a backside and a front side, a substructure formed on the front side of the substrate and including an active layer, and a superstructure formed on the substructure, the superstructure including a metallization layer, the integrated circuit further including at least one backside deep trench capacitor structure including:

(a) one or more trenches formed in the backside of the substrate and lined with a first conductive layer, a dielectric, and a second conductive layer;

(b) a first electrical connection between the first conductive layer and a first portion of the metallization layer; and (c) a second electrical connection between the second conductive layer and a second portion of the metallization layer.

2. The invention of claim 1, wherein at least one of the first electrical connection or the second electrical connection is a through-silicon via.

3. The invention of claim 1, wherein at least one of the one or more trenches is formed from the backside of the substrate and through the substrate to the first portion of the metallization layer.

4. The invention of claim 1, wherein the second electrical connection is formed from a capped connector trench.

5. The invention of claim 1, wherein the first conductive layer includes a conductive region of the substrate around at least one of the one or more trenches.

6. The invention of claim 5, wherein the second electrical connection is formed from a connector trench.

7. An integrated circuit including a substrate having a backside and a front side, a substructure formed on the front side of the substrate and including an active layer, and a superstructure formed on the substructure, the superstructure including at least one metallization layer, the integrated circuit further including at least one backside deep trench capacitor structure including:

(a) one or more trenches formed in the backside of the substrate and lined with a first set of layers including a first conductive layer, a dielectric, and a second conductive layer, wherein the first conductive layer of the first set of layers of at least one of the one or more trenches is in electrical contact with a corresponding portion of the at least one metallization layer; and (b) a capped connector trench formed in the backside of the substrate and lined with a second set of layers including a first conductive layer, a dielectric, and a second conductive layer, wherein the first conductive layer and the second conductive layer of the second set of layers of the capped connector trench are shorted together and (1) in electrical contact with the second conductive layer of the first set of layers of the one or more trenches, and (2) in electrical contact with an associated portion of the at least one metallization layer.

8. A method of making at least one backside deep trench capacitor structure in an integrated circuit having a substrate having a backside and a front side, a substructure formed on the front side of the substrate and including an active layer, and a superstructure formed on the substructure, the superstructure including a metallization layer, the method including:

(a) forming one or more trenches in the backside of the substrate;

(b) lining at least one of the one or more trenches with a first conductive layer, a dielectric, and a second conductive layer;

(c) forming a first electrical connection between the first conductive layer and a first portion of the metallization layer; and (d) forming a second electrical connection between the second conductive layer and a second portion of the metallization layer.

9. The method of claim 8, wherein at least one of the first electrical connection or the second electrical connection is a through-silicon via.

10. The method of claim 8, wherein at least one of the one or more trenches is formed from the backside of the substrate and through the substrate to the first portion of the metallization layer.

11. The method of claim 8, further including forming the second electrical connection as a capped connector trench.

12. The method of claim 8, wherein the first conductive layer includes a conductive region of the substrate around at least one of the one or more trenches.

13. The method of claim 12, further including forming the second electrical connection as a connector trench.

14. The method of claim 8, further including mounting the integrated circuit on another structure before making the at least one backside deep trench capacitor structure.

15. The method of claim 14, wherein the other structure is one of an interposer or laminate.

16. The method of claim 14, wherein the other structure is a second integrated circuit.

* * * * *